(12) United States Patent
Taylor et al.

(10) Patent No.: US 7,541,875 B2
(45) Date of Patent: Jun. 2, 2009

(54) HIGH-LINEARITY LOW NOISE AMPLIFIER AND METHOD

(75) Inventors: Stewart S. Taylor, Beaverton, OR (US); Jon S. Duster, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 11/747,250

(22) Filed: May 11, 2007

(65) Prior Publication Data

US 2008/0278220 A1 Nov. 13, 2008

(51) Int. Cl.
*H03F 3/04* (2006.01)
(52) U.S. Cl. .................... 330/311; 330/98; 330/133
(58) Field of Classification Search ......... 330/310–311, 330/302, 150, 98
See application file for complete search history.

(56) References Cited

U.S. PATENT DOCUMENTS 6,177,837 B1 * 1/2001 Aoki et al. .............. 330/98
7,276,976 B2 * 10/2007 Oh et al. ................. 330/311

* cited by examiner

*Primary Examiner*—Robert Pascal
*Assistant Examiner*—Hieu P Nguyen
(74) *Attorney, Agent, or Firm*—Schwegman, Lundberg & Woessner, P.A.; Gregory J. Gorrie

(57) ABSTRACT

Embodiments of a high-linearity low-noise amplifier (LNA) and method are generally described herein. Other embodiments may be described and claimed. In some embodiments, an RF input signal may be amplified with a cascode amplifier and a common-gate stage. The common-gate stage is dynamically biased based on an output voltage of the common-gate stage to allow an output voltage swing to be shared between the cascode amplifier and the common-gate stage.

20 Claims, 2 Drawing Sheets

RECEIVER CIRCUITRY

HIGH-LINEARITY LOW NOISE AMPLIFIER AND METHOD

TECHNICAL FIELD

Some embodiments of the present invention pertain to low-noise amplifiers (LNAs). Some embodiments relate to receivers. Some embodiments relate to receivers that receive orthogonal frequency division multiplexed (OFDM) signals.

BACKGROUND

For operation in a hostile multi-radio environment, a high-performance receiver may need to have a highly-linear and highly-sensitive front end. Highly sensitive LNAs with high-output compression points are difficult to implement in low-voltage scaled CMOS technology due to the larger output swings that are required for high-performance receivers. The use of higher-voltage transistors (e.g., with thicker gate regions) can handle the larger voltage swings but generally have higher noise figures and poorer sensitivity.

Thus, there are general needs for LNAs that have high sensitivity and high-output compression points. There are general needs for LNAs that have high sensitivity and high-output compression points suitable for implementation in low-voltage scaled CMOS technology. There are also general needs for high-performance receivers with highly-linear and highly-sensitive front ends.

DETAILED DESCRIPTION

The following description and the drawings sufficiently illustrate specific embodiments of the invention to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in, or substituted for those of other embodiments. Embodiments of the invention set forth in the claims encompass all available equivalents of those claims. Embodiments of the invention may be referred to herein, individually or collectively, by the term "invention" merely for convenience and without intending to limit the scope of this application to any single invention or inventive concept if more than one is in fact disclosed.

Figure 1:
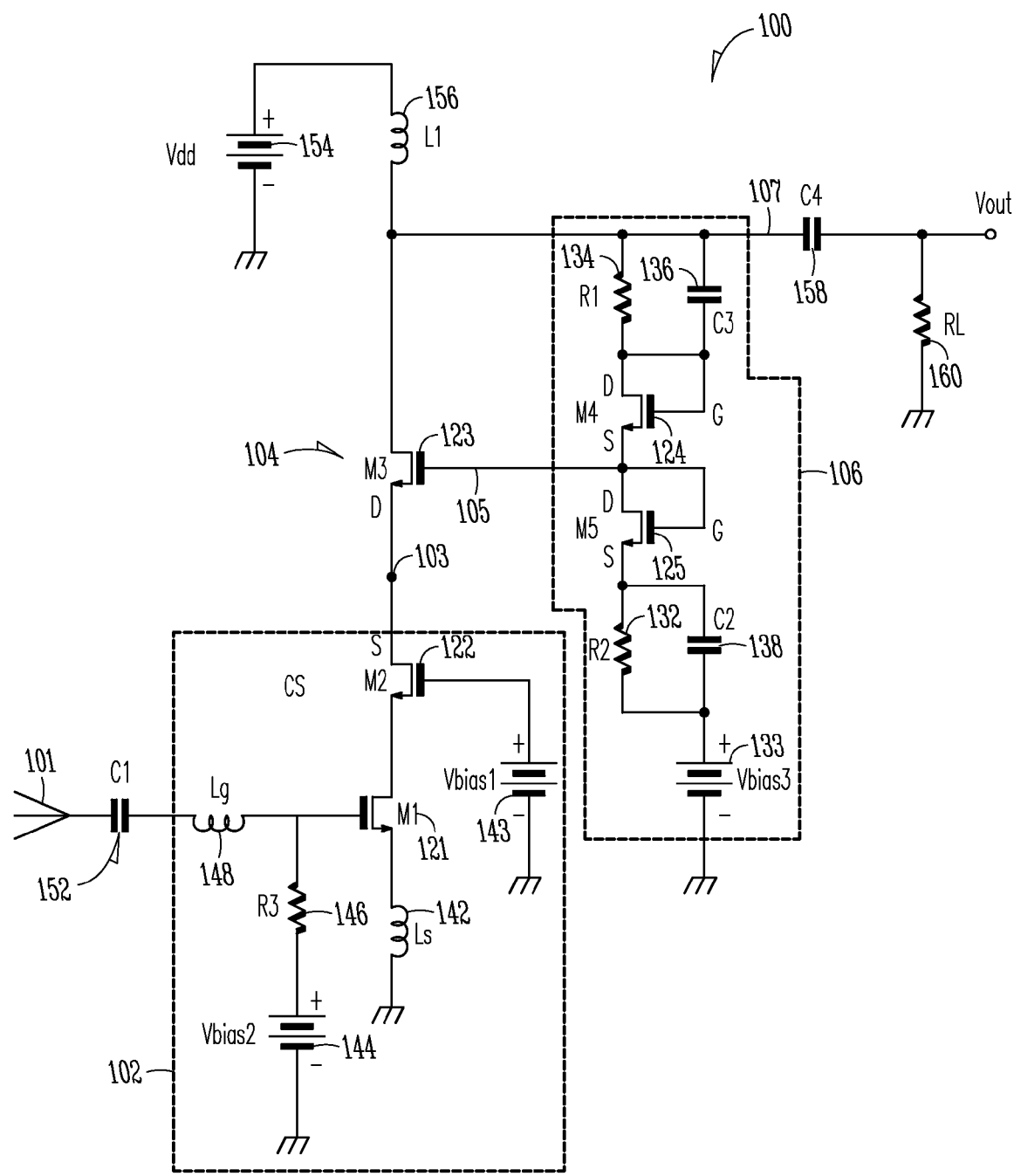
FIG. 1 is a circuit diagram of a LNA in accordance with some embodiments of the present invention.

FIG. 1 is a circuit diagram of a LNA in accordance with some embodiments of the present invention. LNA 100 comprises cascode amplifier 102, common-gate stage 104 coupled to output 103 of cascode amplifier 102, and dynamic biasing circuitry 106. Dynamic biasing circuitry 106 dynamically biases common-gate stage 104 based on output voltage 107 of common-gate stage 104 to allow an output voltage swing to be shared between cascode amplifier 102 and common-gate stage 104. The sharing of the output voltage swing may allow LNA 100 to achieve high sensitivity along with a high-output compression point using lower-voltage devices.

In some embodiments, cascode amplifier 102 comprises common-source transistor (M1) 121 coupled with common-gate transistor (M2) 122. Common-gate stage 104 may comprise common-gate transistor (M3) 123 coupled to output 103 of cascode amplifier 102. Dynamic biasing circuitry 106 may comprise dynamic-biasing transistors (M4) 124 and (M5) 125 configured to form a voltage divider with offset voltage (Vbias3) 133. Accordingly, the gate voltage of transistor 123 may be a portion of the voltage at the drain of transistor 123. In some embodiments, transistor 122 and transistor 123 may have approximately the same drain-to-gate voltage (Vdg) and/or the same drain-to-source voltage (Vds) under large signal conditions, although the scope of the invention is not limited in this respect as there is no requirement that transistors 122 and 123 have approximately the same Vdg or the same Vds under large signal conditions. In this way, transistor 122 and transistor 123 share a large output voltage swing, allowing the use of lower voltage transistors (e.g., by about a factor of two) while maintaining reliable operation. In some embodiments, this may help maximize the 1 dB compression point at the output of common-gate stage 104 providing a maximum linear output voltage swing. The Vdg is one metric that may be used to help determine long-term reliability due to gate oxide wear-out. The Vds may affect punch-through and hot electron affects (e.g., aging and/or a shift in Vt).

In some embodiments, the source of dynamic-biasing transistor 124 may be coupled with the drain of dynamic-biasing transistor 125, and the source of dynamic-biasing transistor 124 and the drain of dynamic-biasing transistor 125 may provide a dynamic gate bias voltage at node 105 for common-gate transistor 123. The dynamic gate bias voltage at node 105 for common-gate transistor 123 may be offset by offset voltage 133.

In some embodiments, offset voltage 133 may be selected based on a source voltage of the first common-gate transistor 122. In some embodiments, offset voltage 133 may be selected to be approximately equal to the source voltage of first common-gate transistor 122, although the scope of the invention is not limited in this respect.

In some embodiments, dynamic biasing circuitry 106 biases common-gate transistor 123 to allow common-gate transistors 122 and 123 to share approximately equal portions of the output voltage swing, although the scope of the invention is not limited in this respect as the portions of the output voltage swing do not necessarily need to be approximately equal. In these embodiments, common-gate transistors 122 and 123 may share approximately equal portions of the output voltage swing at least when operating in a high-gain/high-compression region and/or at high-signal levels, although the scope of the invention is not limited in this respect.

In some embodiments, dynamic-biasing transistors 124 and 125 may be diode-configured transistors (i.e., having their gates and drains coupled together). In these embodiments, the drain and the gate of dynamic-biasing transistor 124 may be coupled together, and the drain and the gate of dynamic-biasing transistor 125 may be coupled together. Dynamic biasing circuitry 106 may also comprise resistive element (R1) 134 and resistive element (R2) 132 in series with dynamic-biasing transistors 124 and 125 as shown in FIG. 1. In these embodiments, resistive elements 134 and 132 may operate as a voltage divider and dynamic-biasing transistors 124 and 126 may modify the divided voltage applied to the gate of common-gate transistor 123, although the scope of the invention is not limited in this respect.

In some embodiments, resistive element 134 may be coupled between output voltage 107 and the drain of dynamic-biasing transistor 124, and resistive element 132 may be coupled between offset voltage 133 and a source of dynamic-biasing transistor 125.

In some embodiments, dynamic biasing circuitry 106 may also include capacitive element (C3) 136 in parallel with resistive element 134, and capacitive element (C2) 138 in parallel with resistive element 138. Capacitive elements 136 and 138 may provide for high-frequency compensation. In these embodiments, capacitive elements 136 and 138 may help compensate for the shunt capacitance from other transistors and/or wiring capacitance, such as to ground.

In some embodiments, common-source transistor 121, common-gate transistor 122, common-gate transistor 123, and dynamic-biasing transistors 124 and 125 may comprise low-breakdown voltage N-MOS transistors, although the scope of the invention is not limited in this respect as the configuration of LNA 100 may also be suitable for use with P-MOS and other types of transistors (e.g., bipolar transistors).

In some embodiments when the transistors of LNA 100 share the same well, the body contacts (not shown) of the transistors may be connected to ground. In other embodiments, when the transistors have separate wells, their body contacts may be connected to the transistor's source, although the scope of the invention is not limited in this respect.

In some embodiments, cascode amplifier 102 may also include source inductance (Ls) 142, gate bias voltage source (Vbias2) 144, gate bias resistance (R3) 146, and gate inductance (Lg) 148. In some embodiments, cascode amplifier 102 may also include gate bias voltage source (Vbias1) 143 to provide a gate bias voltage for common-gate transistor 122. LNA 100 may be separated from a signal source (e.g., an antenna or preselector filter) at input 101 by capacitor 152, which may serve as a DC blocking capacitor and/or an input-matching capacitor. LNA 100 may be coupled to DC bias source (Vdd) 154 through inductor (L1) 156 and the output of LNA 100 may be provided through output capacitor (C4) 158. Inductor 156 and output capacitor 158 may be part of an output matching network that may be selected based on the load of LNA 100, illustrated as load resistor 160 RL.

In some embodiments, the present invention may provide a method of amplifying an RF signal. The method may comprise comprising amplifying the RF input signal with cascode amplifier 102 and common-gate stage 104, and dynamically biasing common-gate stage 104 based on output voltage 107 of common-gate stage 104 to allow an output voltage swing to be shared between cascode amplifier 102 and common-gate stage 104.

In some embodiments, the method may include providing a dynamic gate bias voltage at node 105 at a gate of common-gate transistor 123 with the source of dynamic-biasing transistor 124 and the drain of dynamic-biasing transistor 125, and offsetting the dynamic gate bias voltage at node 105 with offset voltage 133. The dynamically biasing may comprise dynamically biasing common-gate transistor 123 to allow common-gate transistors 122 and 123 to share approximately equal portions of the output voltage swing, although the scope of the invention is not limited in this respect.

In some embodiments, LNA 100 may be part of a differential LNA in which two single-ended LNAs may operate together as a differential LNA. In these embodiments, LNA 100 may operate as a single-ended LNA and another LNA, which may be identical to LNA 100, may operate as the other single-ended LNA. Each single-ended LNA may receive and amplify one portion of a differential signal.

Figure 2:
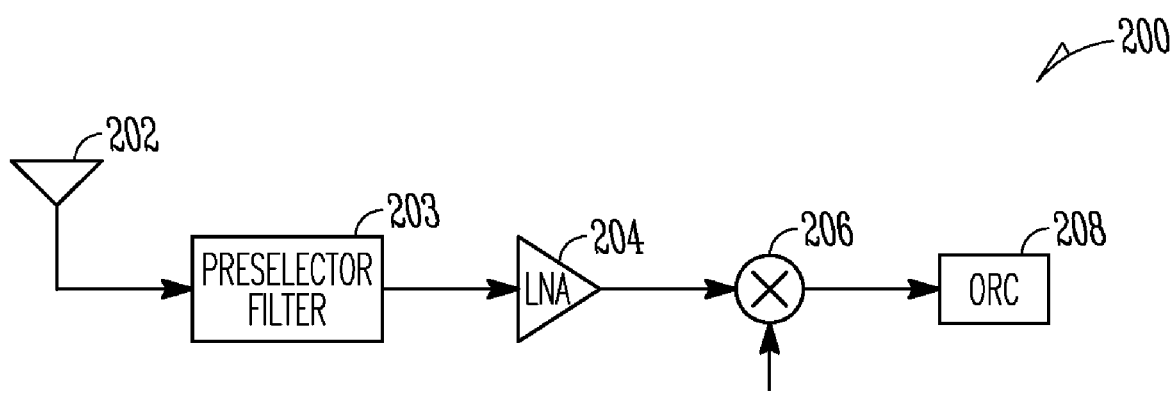
FIG. 2 is a functional block diagram of a receiver in accordance with some embodiments of the present invention.

FIG. 2 is a functional block diagram of a receiver in accordance with some embodiments of the present invention. Receiver 200 comprises preselector filter 203 coupled to antenna 202, LNA 204, downconversion circuitry 206, and other receiver circuitry (ORC) 208. Preselector filter 203 and downconversion circuitry 206 may be optional. Other receiver circuitry 208 may include, for example, a variable gain amplifier, other filter and amplification circuitry as well as baseband processing circuitry. In some embodiments, receiver 200 may be an OFDM receiver suitable for use in a WLAN and/or WiMax system, described in more detail below. In some multiple-input multiple-output (MIMO) embodiments, receiver 200 may have additional receive signal paths each comprising at least antenna 202, LNA 204 and/or downconverter 206, although the scope of the invention is not limited in this respect.

In some embodiments, LNA 204 may amplify RF input signals received through antenna 202 with a cascode amplifier and a common-gate stage. The common-gate stage may be dynamically bias based on the output voltage of the common-gate stage to allow an output voltage swing to be shared between the cascode amplifier and the common-gate stage. In some embodiments, LNA 100 (FIG. 1) may be suitable for use as LNA 204, although other LNA configurations may also be suitable.

Accordingly, embodiments of the present invention allow for the implementation of a high output compression LNA in scaled CMOS technology having a large voltage swing. These embodiments of an LNA may be suitable for use in a high-linearity, high sensitivity receiver, such as receiver 200, suitable for operating in a hostile multi-radio environment in the presence of large blockers. In some embodiments, a preselector filter, such as preselector filter 203 may be eliminated or the requirements may be relaxed reducing costs and/or reducing the footprint of the receiver. The elimination or the relaxation of preselector filter 203 may also improve receiver sensitivity by eliminating or reducing the insertion loss of preselector filter 203, which may typically range between 1.5 and 3 dB. In some embodiments, LNA 204 may be implemented with high $f_t$, low voltage transistors in scaled CMOS. The high-voltage output compliance of an LNA is not achievable with some prior art designs employing high $f_t$, low breakdown voltage devices. Prior art designs that may be able to achieve high-voltage output compliance may require the use of low $f_t$, higher breakdown voltage devices resulting in an LNA with degraded noise figure and lower gain, particularly at high frequencies.

In some embodiments, LNA 204 may comprise a differential LNA comprising two substantially identical single-ended LNAs, such as LNA 100 (FIG. 1). In these embodiments, each single-ended LNA of LNA 204 may amplify one portion of a differential signal provided by antenna 202.

Although receiver 200 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), and combinations of various hardware and logic circuitry for performing at least the functions described herein. In some embodiments, the functional elements of receiver 200 may refer to one or more processes operating on one or more processing elements.

In some embodiments, receiver 200 may be part of a portable wireless communication device, such as a personal digital assistant (PDA), a laptop or portable computer with wireless communication capability, a web tablet, a wireless telephone, a wireless headset, a pager, an instant messaging device, a digital camera, an access point, a television, a medical device (e.g., a heart rate monitor, a blood pressure monitor, etc.), or other device that may receive and/or transmit information wirelessly.

In some embodiments, receiver 200 may be part of a wireless communication device that communicates in accordance with one or more communication techniques and/or standards, such as the Global System for Mobile Communications (GSM) standard. In some embodiments, receiver 200 may receive signals in accordance with a spread-spectrum technique, such as code division multiple access (CDMA). In some embodiments, receiver 200 may be a multicarrier transmitter that may receive orthogonal frequency division multiplexed (OFDM) communication signals over a multicarrier communication channel. The OFDM signals may comprise a plurality of orthogonal subcarriers. In some of these multicarrier embodiments, receiver 200 may be part of a wireless local area networks (WLANs) communication station such as a wireless access point (AP), base station or a mobile device including a Wireless Fidelity (WiFi) device. In some multicarrier embodiments, receiver 200 may be part of a broadband wireless access (BWA) network communication station, such as a Worldwide Interoperability for Microwave Access (WiMax) communication station, although the scope of the invention is not limited in this respect.

In some embodiments, receiver 200 may communicate in accordance with specific communication standards, such as the Institute of Electrical and Electronics Engineers (IEEE) standards including IEEE 802.11(a), 802.11(b), 802.11(g), 802.11(h) and/or 802.11(n) standards and/or proposed specifications for WLANs, although the scope of the invention is not limited in this respect as they may also be suitable to transmit and/or receive communications in accordance with other techniques and standards. In some embodiments, receiver 200 may communicate in accordance with the IEEE 802.16-2004 and the IEEE 802.16(e) standards for wireless metropolitan area networks (WMANs) including variations and evolutions thereof, although the scope of the invention is not limited in this respect as they may also be suitable to transmit and/or receive communications in accordance with other techniques and standards. For more information with respect to the IEEE 802.11 and IEEE 802.16 standards, please refer to "IEEE Standards for Information Technology—Telecommunications and Information Exchange between Systems"—Local Area Networks—Specific Requirements—Part 11 "Wireless LAN Medium Access Control (MAC) and Physical Layer (PHY), ISO/IEC 8802-11: 1999", and Metropolitan Area Networks—Specific Requirements—Part 16: "Air Interface for Fixed Broadband Wireless Access Systems," May 2005 and related amendments/versions.

Antenna 202 may comprise one or more directional or omnidirectional antennas, including, for example, dipole antennas, monopole antennas, patch antennas, loop antennas, microstrip antennas, or other types of antennas suitable for transmission of RF signals. In some embodiments, instead of two or more antennas, a single antenna with multiple apertures may be used. In these embodiments, each aperture may be considered a separate antenna. In some multiple-input, multiple-output (MIMO) embodiments, the antennas may be effectively separated to take advantage of spatial diversity and the different channel characteristics that may result between each of the antennas a transmitting communication station.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, invention may lie in less than all features of a single disclosed embodiment. Thus, the following claims are hereby incorporated into the detailed description, with each claim standing on its own as a separate preferred embodiment.

What is claimed is:

1. A low-noise amplifier (LNA) comprising:
a cascode amplifier;
a common-gate stage coupled to an output of the cascode amplifier; and
dynamic biasing circuitry to dynamically bias the common-gate stage based on an output voltage of the common-gate stage to allow an output voltage swing to be shared between the cascode amplifier and the common-gate stage,
wherein the dynamic biasing circuitry comprises first and second dynamic-biasing transistors configured to form a voltage divider with an offset voltage.

2. A low-noise amplifier (LNA) comprising:
a cascode amplifier;
a common-gate stage coupled to an output of the cascode amplifier; and
dynamic biasing circuitry to dynamically bias the common-gate stage based on an output voltage of the common-gate stage to allow an output voltage swing to be shared between the cascode amplifier and the common-gate stage,
wherein the cascode amplifier comprises a common-source transistor coupled with a first common-gate transistor,
wherein the common-gate stage comprises a second common-gate transistor coupled to an output of the cascode amplifier, and
wherein the dynamic biasing circuitry comprises first and second dynamic-biasing transistors configured to form a voltage divider with an offset voltage.

3. The LNA of claim 2 wherein a source of the first dynamic-biasing transistor is coupled with a drain of the second dynamic-biasing transistor,
wherein the source of the first dynamic-biasing transistor and the drain of the second dynamic-biasing transistor provide a dynamic gate bias voltage for the second common-gate transistor, and
wherein the dynamic gate bias voltage for the second common-gate transistor is offset by the offset voltage.

4. The LNA of claim 3 wherein the offset voltage is selected based on a source voltage of the first common-gate transistor.

5. The LNA of claim 3 wherein the dynamic biasing circuitry biases the second common-gate transistor to allow the first and second common-gate transistors to share approximately equal portions of the output voltage swing.

6. The LNA of claim 3 wherein the dynamic-biasing transistors comprise diode-configured transistors having their gates and drains coupled together, and
wherein the dynamic biasing circuitry further comprises a first resistive element and a second resistive element in series with the dynamic-biasing transistors.

7. The LNA of claim 6 wherein the first resistive element is coupled between the output voltage and a drain of the first dynamic-biasing transistor, wherein the second resistive element is coupled between the offset voltage and a source of the second dynamic-biasing transistor, and wherein the dynamic biasing circuitry further comprises:

a first capacitive element parallel with the first resistive element, and a second capacitive element parallel with the second resistive element, wherein the first and second capacitive elements provide high-frequency compensation.

8. The LNA of claim 3 wherein the common-source transistor, the first common-gate transistor, the second common-gate transistor, and the first and second dynamic-biasing transistors comprise N-MOS transistors.

9. The LNA of claim 1 wherein the LNA is a first single-ended LNA that is part of a differential LNA comprising the first single-ended LNA and a second single-ended LNA substantially identical to the first single-ended LNA, wherein each single-ended LNA is to amplify each portion of a differential signal.

10. A method of amplifying comprising:

amplifying an RE input signal with a cascode amplifier and a common-gate stage coupled to an output of the cascode amplifier; and dynamically biasing the common-gate stage based on an output voltage of the common-gate stage to allow an output voltage swing to be shared between the cascode amplifier and the common-gate stage, wherein the dynamic biasing circuitry comprises first and second dynamic-biasing transistors configured to form a voltage divider with an offset voltage.

11. A method of amplifying comprising:

amplifying an RE input signal with a cascode amplifier and a common-gate stage coupled to an output of the cascode amplifier; and dynamically biasing the common-gate stage based on an output voltage of the common-gate stage to allow an output voltage swing to be shared between the cascode amplifier and the common-gate stage, wherein the cascode amplifier comprises a common-source transistor coupled with a first common-gate transistor, wherein the common-gate stage comprises a second common-gate transistor coupled to an output of the cascode amplifier, and wherein the dynamic biasing circuitry comprises first and second dynamic-biasing transistors configured to form a voltage divider with an offset voltage.

12. The method of claim 11 wherein a source of the first dynamic-biasing transistor is coupled with a drain of the second dynamic-biasing transistor, wherein the method further comprises:

providing a dynamic gate bias voltage at a gate of the second common-gate transistor with the source of the first dynamic-biasing transistor and the drain of the second dynamic-biasing transistor; and offsetting the dynamic gate bias voltage with the offset voltage.

13. The method of claim 12 wherein the dynamically biasing comprises dynamically biasing the second common-gate transistor to allow the first and second common-gate transistors to share approximately equal portions of the output voltage swing.

14. A receiver comprising a low-noise amplifier (LNA) to amplify an RF signal received through an antenna, wherein the LNA comprises a cascode amplifier, a common-gate stage coupled to an output of the cascode amplifier, and dynamic biasing circuitry to dynamically bias the common-gate stage based on an output voltage of the common-gate stage to allow an output voltage swing to be shared between the cascode amplifier and the common-gate stage, wherein the dynamic biasing circuitry comprises first and second dynamic-biasing transistors configured to form a voltage divider with an offset voltage.

15. A receiver comprising a low-noise amplifier (LNA) to amplify an RF signal received through an antenna, wherein the LNA comprises a cascode amplifier, a common-gate stage coupled to an output of the cascode amplifier, and dynamic biasing circuitry to dynamically bias the common-gate stage based on an output voltage of the common-gate stage to allow an output voltage swing to be shared between the cascode amplifier and the common-gate stage, wherein the cascode amplifier comprises a common-source transistor coupled with a first common-gate transistor, wherein the common-gate stage comprises a second common-gate transistor coupled to an output of the cascode amplifier, and wherein the dynamic biasing circuitry comprises first and second dynamic-biasing transistors configured to form a voltage divider with an offset voltage.

16. The receiver of claim 15 wherein a source of the first dynamic-biasing transistor is coupled with a drain of the second dynamic-biasing transistor, wherein the source of the first dynamic-biasing transistor and the drain of the second dynamic-biasing transistor provide a dynamic gate bias voltage for the second common-gate transistor, and wherein the dynamic gate bias voltage for the second common-gate transistor is offset by the offset voltage.

17. The receiver of claim 16 wherein the offset voltage is selected based on a source voltage of the first common-gate transistor.

18. The receiver of claim 16 wherein the dynamic biasing circuitry biases the second common-gate transistor to allow the first and second common-gate transistors to share approximately equal portions of the output voltage swing.

19. The receiver of claim 16 wherein the dynamic-biasing transistors comprise diode-configured transistors having their gates and drains coupled together, and wherein the dynamic biasing circuitry further comprises a first resistive element and a second resistive element in series with the dynamic-biasing transistors.

20. The receiver of claim 14 wherein the LNA is a differential LNA to amplify differential signals provided by an antenna, wherein the differential LNA comprises two substantially identical single-ended LNAs, and wherein each single-ended LNA comprises a cascode amplifier, a common-gate stage coupled to an output of the cascode amplifier, and dynamic biasing circuitry to dynamically bias the common-gate stage based on an output voltage of the common-gate stage to allow an output voltage swing to be shared between the cascode amplifier and the common-gate stage.

* * * * *